United States Patent
Andideh

(10) Patent No.: US 6,740,579 B2
(45) Date of Patent: May 25, 2004

(54) METHOD OF MAKING A SEMICONDUCTOR DEVICE THAT INCLUDES A DUAL DAMASCENE INTERCONNECT

(75) Inventor: Ebrahim Andideh, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 52 days.

(21) Appl. No.: 10/174,804

(22) Filed: Jun. 18, 2002

(65) Prior Publication Data

US 2003/0232499 A1 Dec. 18, 2003

(51) Int. Cl.⁷ .......................................... H01L 21/4763
(52) U.S. Cl. .................. 438/623; 438/622; 438/636; 438/637; 438/638; 257/759
(58) Field of Search ................ 438/622–628, 438/631, 633, 634, 636–638; 257/750, 759, 760, 758

(56) References Cited

U.S. PATENT DOCUMENTS

| | | | | |
|---|---|---|---|---|
| 5,439,780 A | * | 8/1995 | Joshi et al. | 430/296 |
| 5,559,367 A | * | 9/1996 | Cohen et al. | 257/77 |
| 5,877,075 A | * | 3/1999 | Dai et al. | 438/597 |
| 6,281,115 B1 | * | 8/2001 | Chang et al. | 438/637 |
| 6,294,315 B2 | * | 9/2001 | Shin et al. | 430/313 |
| 6,319,809 B1 | * | 11/2001 | Chang et al. | 438/597 |
| 6,350,675 B1 | * | 2/2002 | Chooi et al. | 438/624 |
| 6,448,655 B1 | * | 9/2002 | Babich et al. | 257/759 |
| 6,458,691 B1 | * | 10/2002 | Subramanian et al. | 438/638 |
| 6,472,231 B1 | * | 10/2002 | Gabriel et al. | 438/9 |
| 6,472,317 B1 | * | 10/2002 | Wang et al. | 438/638 |
| 6,492,263 B1 | * | 12/2002 | Peng et al. | 438/637 |
| 6,495,451 B2 | * | 12/2002 | Hattori et al. | 438/638 |
| 6,514,671 B1 | * | 2/2003 | Parikh et al. | 430/313 |
| 6,514,857 B1 | * | 2/2003 | Naik et al. | 438/638 |
| 6,589,711 B1 | * | 7/2003 | Subramanian et al. | 430/311 |
| 2001/0012689 A1 | * | 8/2001 | Okoroanyanwu et al. | 438/637 |
| 2002/0164544 A1 | * | 11/2002 | Luckanc et al. | 430/314 |
| 2002/0187627 A1 | * | 12/2002 | Yuang | 438/622 |
| 2003/0003765 A1 | * | 1/2003 | Gibson et al. | 438/760 |
| 2003/0134505 A1 | * | 7/2003 | Dalton et al. | 438/637 |
| 2003/0224593 A1 | * | 12/2003 | Wong | 438/629 |

* cited by examiner

*Primary Examiner*—Long Pham
*Assistant Examiner*—Thao X. Le
(74) *Attorney, Agent, or Firm*—Mark V. Seeley

(57) ABSTRACT

An improved method for making a semiconductor device is described. That method includes forming a first dielectric layer on a substrate, then forming on the first dielectric layer a second dielectric layer. The second dielectric layer is made from a material that is more sensitive to radiation of a specified wavelength and energy than is the material from which the first dielectric layer is made. After the first dielectric layer and the second dielectric layer are exposed to radiation of a specified wavelength and energy, a portion of the first dielectric layer is removed to form a via, and a portion of the second dielectric layer is removed to form a trench. The via and trench are then filled with a conductive material.

18 Claims, 1 Drawing Sheet

METHOD OF MAKING A SEMICONDUCTOR DEVICE THAT INCLUDES A DUAL DAMASCENE INTERCONNECT

FIELD OF THE INVENTION

The present invention relates to a method for making semiconductor devices, particularly those that include a dual damascene interconnect.

BACKGROUND OF THE INVENTION

Dual damascene interconnects may enable reliable low cost production of high speed semiconductor devices that have gate lengths of 0.18 micron or less. A conventional process for making devices that include such an interconnect includes the following steps. A first barrier layer, e.g., one containing silicon nitride, is formed on a substrate to prevent copper from diffusing into a dielectric layer, which is subsequently deposited onto the barrier layer. A via and trench are then etched into the dielectric layer. A second barrier layer, e.g., a metal based layer, is formed to line the via and trench, followed by filling the via and trench with copper. This metal based barrier layer prevents copper from diffusing into the dielectric layer. After applying a chemical mechanical polishing ("CMP") step to remove copper from the surface of the dielectric layer, the process is repeated with a diffusion barrier layer being deposited on the copper and the dielectric layer, followed by forming another dielectric layer on top of that barrier layer, and so on.

When certain low-k materials are used to form the dielectric layer, these conventional dual damascene processes may require a hard mask to be formed on the dielectric layer to protect it when the trench and via are formed. In addition, separate photoresist patterning and etching sequences are required to create the via and trench. Such extra process steps increase process complexity and cost.

Accordingly, there is a need for a less complicated and less expensive process for making a semiconductor device that includes a dual damascene interconnect. There is a need for such a process that forms such an interconnect within a low-k dielectric material. The present invention provides such a process.

DETAILED DESCRIPTION OF THE PRESENT INVENTION

Figure 1A:
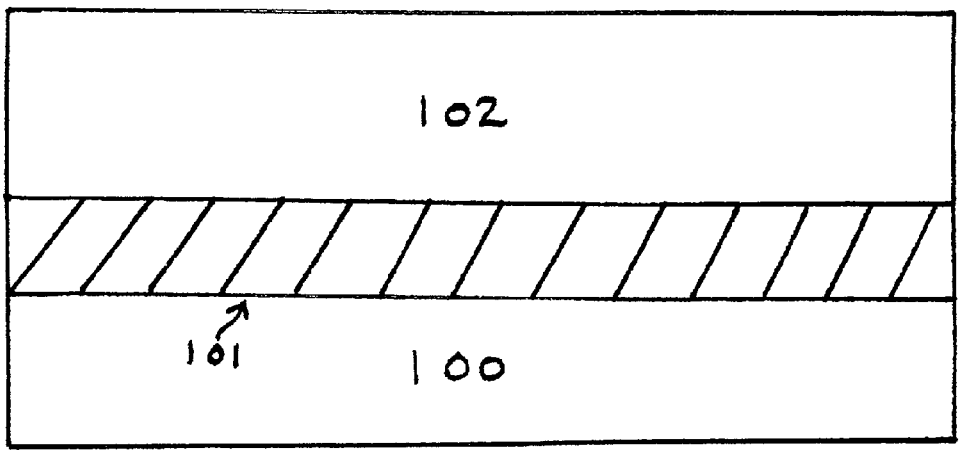
FIGS. 1a–1c represent cross-sections of structures that may result when certain steps are used to carry out an embodiment of the method of the present invention.

An improved method for making a semiconductor device is described. In that method, first dielectric layer 101 is formed on substrate 100, followed by forming second dielectric layer 102 on first dielectric layer 101, as shown in FIG. 1a. Substrate 100 may be any surface, generated when making a semiconductor device, upon which a dielectric layer may be formed. Substrate 100 may include one or more conductive layers upon which first dielectric layer 101 may be formed.

If desired to insulate such a conductive layer or layers from first dielectric layer 101, a first barrier layer (not shown) may be formed on substrate 100 prior to forming first dielectric layer 101 on that barrier layer. Such a barrier layer may prevent an unacceptable amount of copper, or other metal, from diffusing into first dielectric layer 101. It may be formed in the conventional manner from silicon nitride, or other materials that can serve such a diffusion inhibiting function, e.g., silicon carbide, silicon oxycarbide or silicon oxynitride. Although forming such a first barrier layer may be desirable in some cases, one need not necessarily be formed to practice the method of the present invention.

First dielectric layer 101 and second dielectric layer 102 each comprise a photosensitive material, i.e., a material that dissolves in a developer solution after it is exposed to radiation of a specified wavelength and energy. The materials used to form layers 101 and 102 behave like photoresist, in the sense that exposure to light modifies their properties, which enables exposed portions to be removed while protected portions remain. Because the via will be formed within first dielectric layer 101, that layer preferably should be between about 100 and about 800 nanometers thick. Because the trench will be formed within second dielectric layer 102, that layer preferably should be between about 100 and about 1,700 nanometers thick. The combination of layers 101 and 102 may be between about 200 and about 2,500 nanometers thick.

Preferred materials for forming layers 101 and 102 have a dielectric constant that is less than or equal to about 3.0. When such low-k materials are used to make layers 101 and 102, the capacitance between various conductive elements, which those layers separate, will be reduced—when compared to the capacitance resulting from use of conventional dielectric materials such as silicon dioxide. Such reduced capacitance will decrease RC delay and undesirable crosstalk. This, in turn, should allow the device to operate at a higher speed.

First dielectric layer 101 and second dielectric layer 102 may each comprise an organic polymer, e.g., a polyimide or polyarylene ether. Layers 101 and 102 may, for example, be derived from commercially available polymers—like those sold by Honeywell, Inc., under the trade name FLARE™, and by the Dow Chemical Company, under the trade name SiLK™. To be used in the method of the present invention, such commercially available materials may have to be modified to give them the desired photosensitivity. The appropriate organic polymers may be spin coated onto substrate 100 using conventional equipment and process steps.

In the method of the present invention, second dielectric layer 102 is more sensitive to radiation of a specified wavelength and energy than is first dielectric layer 101. As a result, after those layers are exposed to radiation of a given wavelength and energy, a greater proportion of second dielectric layer 102 will dissolve in a developer solution, when compared to the amount of first dielectric layer 101 that will dissolve in such a solution.

Figure 1B:
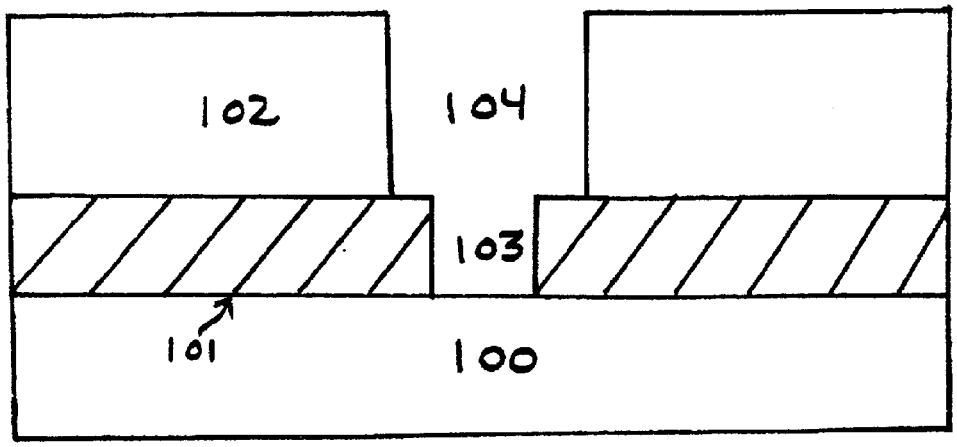

After forming dielectric layers 101 and 102 on substrate 100, a conventional lithographic process may be applied to produce the structure represented by FIG. 1b, in which via 103 has been formed in first dielectric layer 101 and trench 104 has been formed in second dielectric layer 102. Such a structure results, because second dielectric layer 102 is more photosensitive than first dielectric layer 101. A conventional expose and develop process, like a method for exposing and developing photoresist, may be used to generate the FIG. 1b structure. The wavelength used preferably is less than or equal to about 248 nanometers, and the exposure energy (measured by the radiation intensity and exposure duration) must enable a dual damascene interconnect structure to be formed within dielectric layers 101 and 102. Because such conventional process steps are well known to those skilled in the art, they will not be described in further detail here.

In a preferred embodiment, the mask applied during the exposure step defines the critical dimension for the via, and may be aligned with a lower metal layer that the via will contact. Because second dielectric layer 102 is more photosensitive than first dielectric layer 101, portions of layer 102 that extend beyond the area defined for the via are removed during the develop step. This serves to form a trench within second dielectric layer 102 that is positioned above the via that is formed within first dielectric layer 101. As a result of this process step, the trench diameter may be at least about twice the size of the via diameter.

For metal layers that are associated with a high density of closely spaced vias, the method of the present invention may enable a dual damascene interconnect structure to be formed using a single masking step. In other metal layers, where vias will be spaced further apart, it will be necessary to apply a second masking step to define extended portions for the trench. When using the method of the present invention to make longer trenches, a second mask will be used to expose an additional portion of second dielectric layer 102. Less energy should be applied during that exposure step (e.g., by using the same wavelength and intensity, but reducing the time during which the device is exposed) to ensure that only the second dielectric layer is affected. A subsequent develop operation can remove an additional part of second dielectric layer 102, without removing a significant amount of first dielectric layer 101, to complete the trench.

After the via and trench are formed, layers 101 and 102 may be cured to protect the resulting structure during subsequent process steps. To cure layers 101 and 102, the device should be heated for a sufficient time at a sufficient temperature to remove the solvents used to develop those layers and to stabilize the films. In a preferred embodiment, the curing operation comprises heating the device at a temperature of between about 200° C. and about 400° C. for between about 10 minutes and about 2 hours.

Metal based barrier layer 106 may then be deposited to line via 103 and trench 104. Barrier layer 106 will block diffusion into dielectric layers 101 and 102 of copper (or other elements) that will subsequently fill via 103 and trench 104. Barrier layer 106 may also act as a polish stop, when a CMP process is used to remove excess copper from the device. Barrier layer 106 preferably comprises a refractory material, such as tantalum, tantalum nitride or titanium nitride, but may be made from other materials that can inhibit diffusion of copper into dielectric layers 101 and 102. Barrier layer 106 preferably comprises a two layer stack that includes an underlying tantalum nitride layer upon which is formed a tantalum layer. Barrier layer 106 preferably is between about 10 and 50 nanometers thick, and may be formed using a conformal physical vapor deposition or plasma enhanced chemical vapor deposition process.

After forming barrier layer 106, via 103 and trench 104 are filled with a conductive material to form conductive layer 105. Conductive layer 105 may be made from materials conventionally used to form conductive layers for semiconductor devices, and is preferably made from copper. When copper forms conductive layer 105, a conventional copper electroplating process may be used. Such a process typically comprises depositing a seed material (e.g., one made of copper) on barrier layer 106, then performing a copper electroplating process to produce the copper line, as is well known to those skilled in the art.

Figure 1C:
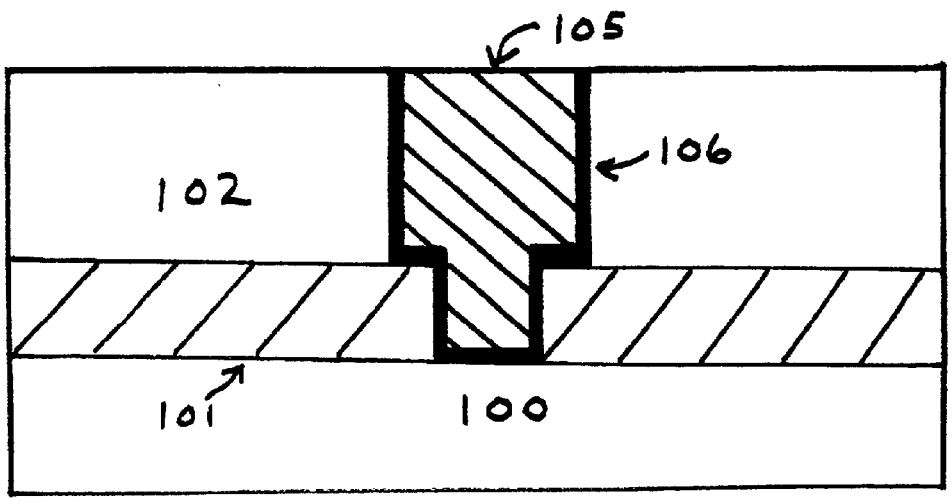

After conductive layer 105 is deposited, the portions of it that extend onto second dielectric layer 102 must be removed. A conventional CMP step may be used to perform that function. By employing a slurry that is selective to barrier layer 106, that barrier layer may act as a polish stop for that operation. Barrier layer 106 will then be removed from the surface of second dielectric layer 102. An over polish process, which removes part of second dielectric layer 102 along with barrier layer 106, may be desirable to ensure that all of barrier layer 106 is removed from that surface. To ensure that significant portions of layer 102 are not removed, when applying a polishing process to remove barrier layer 106 from its surface, it may be desirable to control the duration of the polishing operation. The polishing operation may be followed by a standard cleaning step. The resulting structure is represented by FIG. 1c. The process steps described above may be repeated as necessary to generate a device with the desired number of metal levels. (When a first barrier layer is formed on substrate 100 prior to forming first dielectric layer 101, a third barrier layer, which may comprise silicon nitride, may be formed on second dielectric layer 102 and conductive layer 105. As indicated above, the method of the present invention may be practiced without forming such a barrier layer.)

In the method of the present invention, forming two low-k dielectric layers of differing photosensitivity on a substrate may enable a dual damascene structure to be created without requiring a hard mask to be formed on a dielectric layer. Moreover, by forming such a structure using a photolithographic process, multiple photoresist patterning, etching and cleaning steps can be omitted. In addition, for a metal layer that is associated with closely spaced vias, a single masking step may be sufficient to form the interconnect for that metal layer. For these reasons, the method of the present invention may enable a dual damascene structure to be formed in a less complex and less time consuming manner, when compared to conventional processes for forming such structures.

Features shown in the above referenced drawings are not intended to be drawn to scale, nor are they intended to be shown in precise positional relationship. Additional steps that may be included in the above described method have been omitted as they are not useful to describe aspects of the present invention. Although the foregoing description has specified certain steps and materials that may be used in such a method to make a semiconductor device, those skilled in the art will appreciate that many modifications and substitutions may be made. Accordingly, it is intended that all such modifications, alterations, substitutions and additions be considered to fall within the spirit and scope of the invention as defined by the appended claims.

What is claimed is:

1. A method of making a semiconductor device comprising;
   forming on a substrate a first dielectric layer that dissolves in a developer solution;
   forming on the first dielectric layer a second dielectric layer that dissolves in a developer solution, the second dielectric layer being more sensitive to radiation of a specified wavelength and energy than the first dielectric layer;
   exposing the first dielectric layer and the second dielectric layer to radiation of the specified wavelength and energy; then
   applying a develop step to remove a portion of the first dielectric layer to form a via, and to remove a portion of the second dielectric layer to form a trench; and
   filling the via and trench with a conductive material.

2. The method of claim 1 wherein the conductive material comprises copper.

3. The method of claim 2 further comprising forming a first barrier layer on the substrate, then forming the first dielectric layer on the first barrier layer.

4. The method of claim 3 further comprising lining the via and trench with a second barrier layer prior to filling the via and trench with the conductive material.

5. The method of claim 4 wherein the first barrier layer comprises silicon nitride and the second barrier layer comprises an underlying tantalum nitride layer and a tantalum layer that is formed on the tantalum nitride layer.

6. The method of claim 5 wherein the first dielectric layer and the second dielectric layer each comprise an organic polymer that has a dielectric constant that is less than about 3.0.

7. The method of claim 1 wherein the trench is formed by removing a first part of the second dielectric layer when a portion of the first dielectric layer is removed to form the via, and then removing a second part of the second dielectric layer to complete the trench.

8. The method of claim 7 wherein the via has a first diameter and the first part of the second dielectric layer has a second diameter, and wherein the second diameter is larger than the first diameter.

9. A method of making a semiconductor device comprising:

forming a first barrier layer on a substrate;

forming a first dielectric layer that dissolves in a developer solution on the first barrier layer;

forming on the first dielectric layer a second dielectric layer that dissolves in a developer solution, the second dielectric layer being more sensitive to radiation of a specified wavelength and energy than the first dielectric layer;

exposing the first dielectric layer and the second dielectric layer to radiation of the specified wavelength and energy;

removing a portion of the first dielectric layer to form a via that has a first diameter, and a portion of the second dielectric layer to form a trench that has a second diameter that is greater than the first diameter;

lining the via and trench with a second barrier layer; and filling the via and trench with a conductive material.

10. The method of claim 9 wherein the conductive material comprises copper, the first barrier layer comprises silicon nitride, and the second barrier layer comprises tantalum nitride and tantalum.

11. The method of claim 10 wherein the first dielectric layer and the second dielectric layer each comprise an organic polymer that has a dielectric constant less than about 3.0.

12. The method of claim 11 wherein the first dielectric layer and the second dielectric layer are exposed to radiation at a wavelength that is equal to or less than about 248 nm.

13. The method of claim 12 further comprising applying heat at between about 200° C. and about 400° C. for between about 10 minutes and about 2 hours after forming the via and trench and prior to lining the via and trench with the second barrier layer.

14. The method of claim 13 further comprising removing the conductive material and the second barrier layer except where they fill the via and trench, after the via and trench are filled with the conductive material, then forming a third barrier layer on the conductive material and the second dielectric layer.

15. The method of claim 14 wherein the conductive layer and second barrier layer are removed using a chemical mechanical polishing step and the third barrier layer comprises silicon nitride.

16. A method of making a semiconductor device comprising:

forming a first barrier layer on a substrate;

forming a first dielectric layer that dissolves in a developer solution on the first barrier layer, the first dielectric layer having a dielectric constant that is less than about 3.0;

forming on the first dielectric layer a second dielectric layer, that dissolves in a developer solution the second dielectric layer having a dielectric constant that is less than about 3.0 and the second dielectric layer being more sensitive to radiation of a specified wavelength and energy than the first dielectric layer;

exposing the first dielectric layer and the second dielectric layer to radiation having a wavelength that is equal to or less than about 248 nm;

removing a portion of the first dielectric layer to form a via that has a first diameter, and a portion of the second dielectric layer to form a trench that has a second diameter that is greater than the first diameter;

lining the via and trench with a second barrier layer;

filling the via and trench with copper;

applying a chemical mechanical polishing step to remove the copper and the second barrier layer except where they fill the via and trench; and then forming a third barrier layer on the copper and the second dielectric layer.

17. The method of claim 16 wherein the first barrier layer comprises silicon nitride, the second barrier layer comprises tantalum nitride and tantalum, and the third barrier layer comprises silicon nitride, and wherein the first dielectric layer and the second dielectric layer each comprise an organic polymer.

18. The method of claim 17 further comprising applying heat at between about 200° C. and about 400° C. for between about 10 minutes and about 2 hours after forming the via and trench and prior to lining the via and trench with the second barrier layer.

* * * * *